(12) United States Patent
Matsuyama et al.

(10) Patent No.: US 9,064,809 B2
(45) Date of Patent: Jun. 23, 2015

(54) METHOD FOR REMOVING OXIDE FILM FORMED ON SURFACE OF SILICON WAFER

(71) Applicant: SUMCO CORPORATION, Tokyo (JP)

(72) Inventors: Hiroyuki Matsuyama, Tokyo (JP); Chieko Takada, Tokyo (JP); Junichi Matsuo, Tokyo (JP); Hiroyuki Komatsu, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 13/760,416

(22) Filed: Feb. 6, 2013

(65) Prior Publication Data
US 2013/0224438 A1    Aug. 29, 2013

(30) Foreign Application Priority Data

Feb. 29, 2012    (JP) ................................. 2012-043678

(51) Int. Cl.
*H01L 21/306*    (2006.01)
*H01L 21/02*    (2006.01)
*H01L 21/311*    (2006.01)

(52) U.S. Cl.
CPC .... *H01L 21/30604* (2013.01); *H01L 21/02658* (2013.01); *Y10T 428/24488* (2015.01); *H01L 21/31116* (2013.01); *H01L 21/31144* (2013.01)

(58) Field of Classification Search
CPC ................... H01L 21/02087; H01L 21/67069; H01L 21/31116; H01L 21/0209; H01L 21/30604; H01L 21/31144; H01L 21/321
See application file for complete search history.

(56) References Cited

U.S. PATENT DOCUMENTS

2002/0167781 A1* 11/2002 Matsuki et al. ............... 361/234
2004/0179183 A1*  9/2004 Van Ballegoij et al. ........ 355/72
2007/0148913 A1*  6/2007 Kim ............................. 438/458

FOREIGN PATENT DOCUMENTS

| JP | 62-128520 | | 6/1987 | |
| JP | 2003-273063 | * | 9/2003 | ............ H01L 21/306 |
| JP | 2005-265718 | | 9/2005 | |
| JP | 2006-186174 | | 7/2006 | |

OTHER PUBLICATIONS

Machine translation of JP2005-265718 pulled Jul. 25, 2014.*
Machine translation of JP 2003-273063 pulled Jul. 24, 2014.*

* cited by examiner

*Primary Examiner* — Duy Deo
*Assistant Examiner* — Erin Bergner
(74) *Attorney, Agent, or Firm* — Greenblum & Bernstein, P.L.C.

(57) ABSTRACT

Disclosed is a method for removing an oxide film formed on a surface of a silicon wafer, comprising steps of: preparing a silicon wafer having an oxide film formed thereon; arranging a discoid wafer mounting stage, which has a contact portion with the oxide film being formed of an acid-resistant resin layer, in a reaction container of a vapor-phase etching apparatus; mounting the silicon wafer on the mounting stage in such a manner that a wafer center coincides with a central axis of the mounting stage; and circulating a hydrogen fluoride containing gas into the reaction container and removing the oxide film from an interface between a chamfered surface and a wafer lower surface toward the inner side of the wafer until a desired interval a is obtained, wherein the desired interval a is adjusted by changing a stage diameter of the mounting stage.

10 Claims, 10 Drawing Sheets

(b)

METHOD FOR REMOVING OXIDE FILM FORMED ON SURFACE OF SILICON WAFER

BACKGROUND OF THE INVENTION

1. Field of the Invention

The present invention relates to a method for removing an oxide film by which an excess oxide film formed on a wafer outer peripheral portion is removed by a vapor-phase etching method at a time of forming the oxide film as a top coat for preventing autodoping during, e.g., growth of an epitaxial layer. More particularly, the present invention relates to a method for removing an oxide film that enables removing an excess oxide film formed on a chamfered surface and an end surface of a wafer, accurately removing an oxide film formed on a wafer lower surface with a desired edge relief width, and greatly reducing a smudge region produced near an oxide film outer edge on the wafer lower surface.

2. Description of the Related Art

In the advanced LSI (Large Scale Integration), a low-resistance semiconductor wafer such as a p, $p^+$, or $p^{++}$-type silicon wafer adjusted to a predetermined resistivity by adding a dopant such as boron is used as a substrate, and an epitaxial wafer having an epitaxial wafer with higher resistance than the resistivity of the wafer substrate formed thereto, e.g., a $p/p^+$ epitaxial wafer is used on a surface of this wafer substrate.

Although the epitaxial layer is formed in a reaction container set to a high-temperature state, one of problems in manufacture of the epitaxial wafer is a so-called autodoping phenomenon that a dopant such as boron added to a wafer substrate diffuses to the outside from the wafer substrate and the epitaxial layer serving as a device forming region is contaminated during a high-temperature process for forming the epitaxial layer on this wafer substrate.

To solve such a problem in autodoping, an oxide film is generally conventionally formed on a silicon wafer back surface as a top coat that avoids diffusion of a dopant to the outside before forming an epitaxial layer. Although the oxide film is usually formed by, e.g., a CVD (Chemical Vapor Deposition) method, the oxide film may be partially formed on not only a lower surface of a silicon wafer but also an end surface and a chamfered surface of the wafer, and an edge of a wafer upper surface which is an epitaxial layer forming region during this process. When an epitaxial layer is formed in a state that an excess oxide film is formed on the edge of the wafer upper surface, the epitaxial layer and the oxide film come into contact with each other at this position, and a problem that granular Si particles called nodules are generated in this region occurs.

Since the nodules can be a cause that produces particles in a device process, the above-described contact of the epitaxial layer and the oxide film on the edge of the wafer upper surface must be avoided. Therefore, after processing for forming the oxide film on the wafer lower surface is carried out, before the epitaxial layer is formed, processing of removing the excess oxide film formed on the wafer outer peripheral portion is executed. In general, as shown in FIG. 9, the excess oxide film formed on the chamfered surface and the end surface of the wafer is removed, and the oxide film is removed so as to form a region (an edge relief width) where an oxide film 32 is removed from an interface of the chamfered surface and the wafer lower surface toward the inner side of the wafer until a desired interval a is obtained. It is to be noted that the wafer outer peripheral portion means the edge of the wafer upper surface, the chamfered surface, the end surface, and the edge of the lower surface where the excess oxide film is formed on the surface of the silicon wafer.

As a method for removing the excess oxide film on the wafer outer peripheral portion, a chemical method for bringing an etchant having a solvency action on the oxide film into contact with the wafer outer peripheral portion and removing the oxide film or a mechanical method such as a polishing treatment has been conventionally generally adopted. As the method for removing the oxide film based on the mechanical method, there has been disclosed a method for rotating a wafer while pressing nonwoven fabric cloth impregnated with an etchant against a wafer outer peripheral portion, and thereby removing the oxide film on the wafer outer peripheral portion (see, e.g., Patent Document 1). However, according to this method, the etchant drips toward the wafer lower surface side, performing uniform etching in a wafer outer peripheral direction is difficult, and a problem that an interface of a region where the oxide film (a top coat) is formed on the wafer lower surface and a region where the oxide film on the wafer lower surface is removed is apt to become uneven occurs.

Further, there has been also disclosed a method for polishing a silicon wafer characterized in that an oxide film on a chamfered portion of a wafer is removed and the oxide film on an outer peripheral portion of a wafer back surface is polished in such a manner that a thickness of the oxide film is reduced from a position that is at least 2 mm inside of the outermost peripheral portion of the wafer back surface toward the outside (see, e.g., Patent Document 2). This method can prevent particles from adhering to the surface after handling and provide a silicon wafer whose resistivity is not lowered due to autodoping. However, the method for removing an oxide film based on the mechanical method is superior in an oxide film removing accuracy, but the outer peripheral portion of the wafer can be polished in a single-wafer treatment alone, productivity is poor, a configuration of the apparatus becomes big, and a cost disadvantageously increases.

On the other hand, as a method for analyzing a metal impurity that is present on a silicon surface, there has been disclosed a method for analyzing an impurity that adopts a method for removing an oxide film based on a vapor-phase etching method (see, e.g., Patent Document 3). According to this method, an oxide film is formed on a surface on an upper side of a silicon wafer as an analysis target, then the wafer is mounted on a stage installed in a chamber of a vapor-phase etching apparatus with the wafer surface having the oxide film formed thereon as the upper side. Then, for example, vapor containing a hydrofluoric acid and a hydrogen peroxide solution is supplied into the chamber, and the oxide film on the wafer surface is dissolved and removed. Further, droplets are supplied to the wafer surface from which the oxide film has been removed, and an impurity in the recovered droplets is analyzed.

Patent Document 1
Japanese Unexamined Patent Application Publication No. Sho 62-128520 (L. 3 from the bottom of the left lower column to L. 6 of the right lower column in P. 3, FIG. 2)
Patent Document 2
Japanese Unexamined Patent Application Publication No. 2006-186174 (claim 1, paragraph [0010])
Patent Document 3
Japanese Unexamined Patent Application Publication No. 2005-265718

The present inventors turned their attention to applying the vapor-phase etching technology adopted in the analyzing method disclosed in Patent Document 3 to removal of an excess oxide film formed on the wafer outer peripheral portion. However, as a result of conducting various kinds of experiments, the present inventors acquired the following knowledge.

It was revealed that using the vapor-phase etching method enables removing an excess oxide film formed on an upper surface, a chamfered surface, an end surface, or the like of a wafer, but controlling the oxide film formed on a wafer lower surface to a desired edge relief width (an interval a) is difficult. In particular, in case of increasing a removal width of an oxide film outer peripheral edge on the wafer lower surface and manufacturing a silicon wafer with a wide edge relief width, it was confirmed that increasing the removal width of the oxide film outer peripheral edge has a limit even though a treatment time is increased at a time of vapor-phase etching.

Further, it was confirmed that, when a silicon wafer having an oxide film removed from a wafer outer peripheral portion by the vapor-phase etching method was subjected to epitaxial growth, there occurs a drawback that such an oxide film removal uneven region where a thickness of the oxide film varies (which will be referred to as a smudge region 33 hereinafter) as shown in FIG. 10 is extensively formed near an outer peripheral edge of the oxide film formed on the wafer lower surface.

Generation of the smudge region hardly directly affects the quality of the wafer but, when a width of the smudge region increases to some extent, a product is considered as a product with poor appearance and cannot be shipped. In this case, the entire oxide film must be temporarily removed, the oxide film must be again produced, then the vapor-phase etching has to be carried out, and hence a problem such as an increase in manufacturing cost arises. Further, since the smudge region is a region where the oxide film is very thinly formed, nodules may be possibly generated in the smudge region during an epitaxial growth treatment. Furthermore, when a width of the smudge region is large, a dopant in the silicon wafer may possibly diffuse outward through each position at which the smudge region with the thin oxide film is generated. Therefore, at a time of removing the excess oxide film formed on the wafer outer peripheral portion by the vapor-phase etching method, reducing the generation of the smudge region is effective.

SUMMARY OF THE INVENTION

Accordingly, the object of the present invention is to provide a method for removing an oxide film that enables removing an excess oxide film formed on a chamfered surface and an end surface of a wafer, accurately removing the oxide film formed on a wafer lower surface with a desired edge relief width, and greatly reducing an oxide film removal uneven region (a smudge region), where a thickness of the oxide film varies, formed near an oxide film outer edge on the wafer lower surface.

According to a first aspect of the present invention, there is provided a method for removing an oxide film formed on a surface of a silicon wafer, comprising steps of: preparing a silicon wafer which has an upper surface, a lower surface, a chamfered surface, and an end surface and has an oxide film formed on at least the entire lower surface of the silicon wafer; arranging one or more discoid wafer mounting stages, each of which has at least a contact portion with the oxide film being formed of an acid-resistant resin layer, in a reaction container of a vapor-phase etching apparatus; mounting the silicon wafer on the mounting stage in such a manner that the lower surface of the silicon wafer faces an upper face of the mounting stage and a wafer center coincides with a central axis of the mounting stage; and circulating a hydrogen fluoride containing gas into the reaction container and removing the oxide film from an interface between the chamfered surface and the wafer lower surface toward the inner side of the wafer until a desired interval a is obtained, wherein the desired interval a is adjusted by changing a stage diameter of the mounting stage.

A second aspect of the present invention provides an invention based on the first aspect, and it is characterized in that surface roughness Ra of the mounting stage at the contact portion with the oxide film is 0.5 µm or below.

A third aspect of the present invention provides an invention based on the second aspect, and it is characterized in that the surface roughness Ra of the mounting stage at the contact portion with the oxide film is 0.4 µm or below.

A fourth aspect of the present invention provides an invention based on the first aspect, and it is characterized in that the mounting stage is made of any one selected from polyvinyl chloride, polyvinylidene chloride, polyethylene, polypropylene, and polytetrafluoroethylene.

A fifth aspect of the present invention provides an invention based on the first aspect, and it is characterized in that the mounting stage is formed by attaching a resin film having the surface roughness Ra of 0.5 µm or below to the surface thereof.

A sixth aspect of the present invention provides an invention based on the fifth aspect, and it is characterized in that the surface roughness Ra of the resin film is 0.4 µm or below.

A seventh aspect of the present invention provides an invention based on the fifth aspect, and it is characterized in that the resin film is made of any one selected from polyvinyl chloride, polyvinylidene chloride, polyethylene, polypropylene, and polytetrafluoroethylene.

An eight aspect of the present invention provides an invention based on the first aspect, and it is characterized in that a stage having a concave portion formed at a central part of a mounting surface is used as the mounting stage.

A ninth aspect of the present invention provides an epitaxial wafer, wherein an upper surface of a silicon wafer having an oxide film removed therefrom by the method according to the first aspect is subjected to an epitaxial growth treatment.

In the method for removing an oxide film according to the first aspect of the present invention, when the stage diameter of the mounting stage is changed, the removal width of the oxide film outer peripheral edge on the wafer lower surface, i.e., an edge relief width (an interval a) can be arbitrarily adjusted.

In the method for removing an oxide film according to the second or third aspect of the present invention, the surface roughness Ra of the mounting stage at the contact portion with the oxide film is set to be less than the predetermined value. As a result, the adhesion between the mounting stage surface and the oxide film formed on the silicon wafer lower surface is improved, and the smudge region can be greatly reduced.

In the method for removing an oxide film according to the fourth aspect of the present invention, the mounting stage is made of any one selected from polyvinyl chloride, polyvinylidene chloride, polyethylene, polypropylene, and polytetrafluoroethylene. These materials have excellent acid resistance and can obtain an effect of avoiding production of scratch at a time of disposing a wafer.

In the method for removing an oxide film according to the fifth or sixth aspect of the present invention, the resin film having the desired surface roughness is attached to the surface of the mounting stage. When the resin film having the desired surface roughness is used in this manner, the stage surface can readily have the desired surface roughness without greatly improving the existing apparatus.

In the method according to the seventh aspect of the present invention, the resin film is made of any one selected from polyvinyl chloride, polyvinylidene chloride, polyethylene, polypropylene, and polytetrafluoroethylene. These materials have excellent acid resistance and can obtain an effect of avoiding production of scratch at a time of disposing a wafer.

In the method according to the eighth aspect of the present invention, when the stage having the concave portion formed at the central part of the mounting surface is used as the mounting stage, the adhesion of the mounting stage surface and the oxide film formed on the wafer lower surface can be improved, and the smudge region can be further reduced.

In the epitaxial wafer according to the ninth aspect of the present invention, the excess oxide film is removed by the method according to the present invention, and the epitaxial growth treatment is performed with respect to the upper surface of this wafer. This epitaxial wafer is obtained by performing the epitaxial treatment with respect to the silicon wafer with less smudge region from which the excess oxide film has been removed by the method according to the present invention. Therefore, at a time of the epitaxial treatment, nodules caused due to the smudge region are not produced, and occurrence of autodoping can be assuredly avoided.

DETAILED DESCRIPTION OF THE PREFERRED EMBODIMENTS

Embodiments for carrying out the present invention will now be described with reference to the attached drawings hereinafter.

Figure 1:
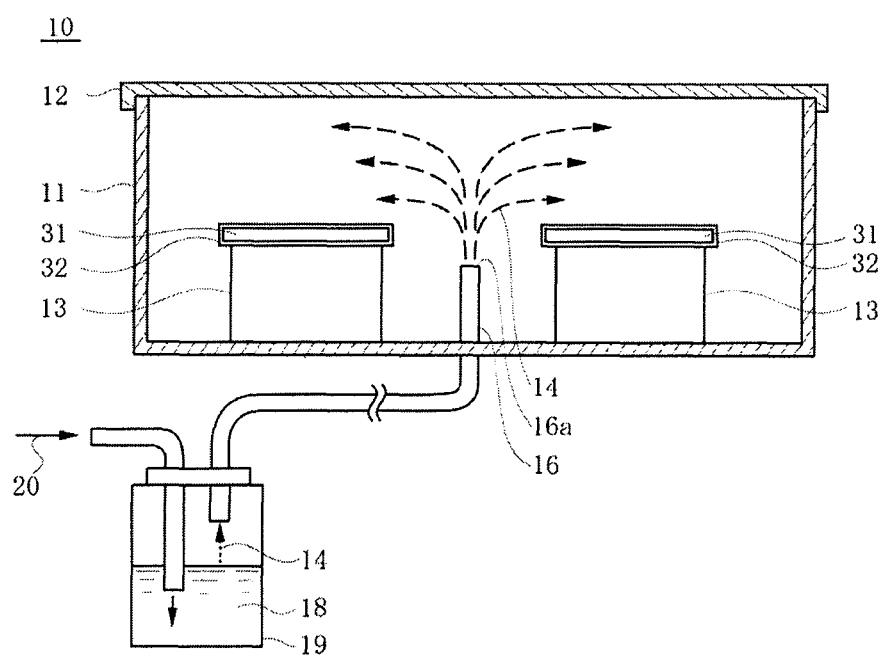
FIG. 1 is a schematic cross-sectional view showing an example of a vapor-phase etching apparatus used in a method according to an embodiment of the present invention.

An example of a vapor-phase etching apparatus for use in a method for removing an oxide film according to the present invention will now be described with reference to FIG. 1. As shown in FIG. 1, this vapor-phase etching apparatus 10 comprises a reaction container 11 which contains a silicon wafer 31 and to which an etching gas 14 is supplied. The reaction container 11 is hermetically sealed by an upper lid 12 and configured to maintain an internal temperature and pressure constant and retain the supplied etching gas 14 therein. Moreover, one or more mounting stages 13 configured to horizontally holds each silicon wafer 31 in the reaction container 11 during vapor-phase etching are provided in the reaction container 11. It is to be noted FIG. 1 shows an example where two stages are provided.

A gas supply tube 16 is provided in the reaction container 11, a carrier gas 20 such as $N_2$ is blown into an aqueous solution 18 such as a hydrofluoric acid aqueous solution, and an etching gas 14 generated by bubbling is supplied into the reaction container 11 through a gas supply opening 16a. The supplied etching gas 14 is used for removal of an oxide film 32 and discharged to the outside of a system through a non-illustrated gas exhaust tube.

A description will now be given as to a method for removing the oxide film 32 formed on an outer peripheral portion of the silicon wafer 31 according to the present invention by using the vapor-phase etching apparatus 10 shown in FIG. 1. It is to be noted that the method for removing an oxide film according to the present invention is not restricted to the method using this apparatus.

First, a silicon wafer that has an upper surface, a lower surface, a chamfered surface, and an end surface, and also has an oxide film formed on at least the lower surface, the chamfered surface, and the end surface by, e.g., a CVD method is prepared. The silicon wafer 31 is obtained by cutting and slicing a silicon single crystal ingot grown by, e.g., a Czochralski method (which will be referred to as a CZ method hereinafter), performing a general processing treatment such as chamfering, mechanical polishing (lapping), etching, mirror polishing (polishing), and others to an obtained wafer, and carrying out a cleaning process. Here, for example, in order to obtain a p-type silicon wafer having a resistivity of approximately 0.01 Ω·cm to 0.1 Ω·cm, at a time of pulling a silicon single crystal based on the CZ method, boron or the like, whose amount allows the resistivity to fall within the above-described range, is added as a dopant into a crucible filled with high-purity silicon polycrystal as a silicon raw material in a pulling apparatus in advance. Boron whose amount allows the resistivity to become approximately 10 mΩcm to 20 mΩ·cm is added in case of a $p^+$-type silicon wafer, and boron whose amount allows the resistivity to become approximately 1 mΩ·cm to 10 mΩ·cm is added in case of a $p^{++}$-type silicon wafer.

The formation of the oxide film based on the CVD method is carried out by performing film formation using a vapor-phase etching apparatus and, if a wafer has a diameter of 300 mm, the oxide film is formed with a film thickness of approximately 2000 to 9000 angstroms.

Figure 2:
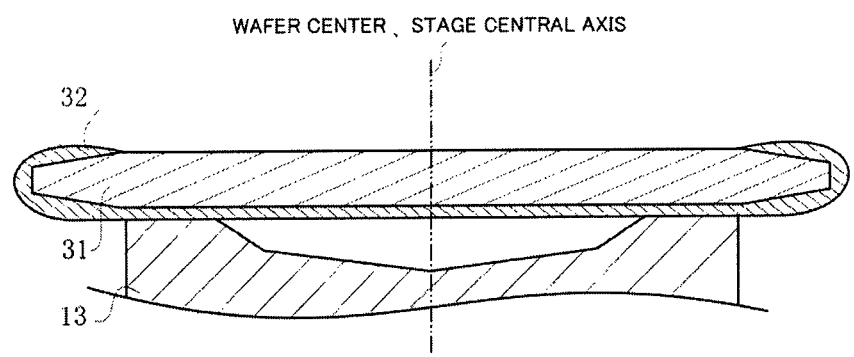
FIG. 2 is an enlarged cross-sectional view of a primary part showing a state that each silicon wafer before or after a vapor-phase etching treatment according to the embodiment of the present invention is mounted on a mounting stage.
Figure 2:
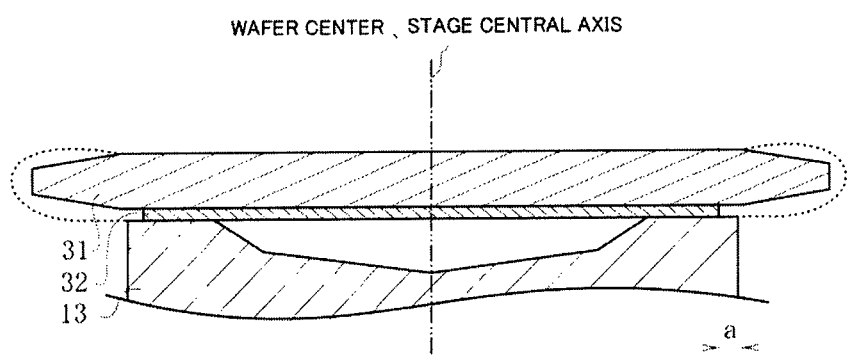

Additionally, in regard to the silicon wafer 31 having the oxide film 32 formed thereon, as shown in FIG. 2(a) and FIG. 2(b), the vapor-phase etching treatment is carried out in order to remove the excess oxide film 32 formed on the outer peripheral portion of this wafer. In this vapor-phase etching, the oxide film 32 is removed in the range of a desired interval a from an interface of the chamfered surface and the wafer lower surface toward the inner side so that a desired edge relief width can be obtained. At this time, the desired width a shown in FIG. 2(b) is set in accordance with the resistivity of the wafer. For example, in a silicon wafer having a very low resistivity like a p$^{++}$-type silicon wafer, since a large amount of a dopant such as boron is added, an amount of the dopant diffused outward is increased during a high-temperature process such as epitaxial growth, the desired interval a is set to be relatively small.

In the method for removing an oxide film according to the present invention, using a method of adjusting a diameter of the mounting stage in accordance with the target desired interval a during the vapor-phase etching enables accurately adjusting a removal width of an oxide film outer peripheral edge on the wafer lower surface, and the edge relief width can be arbitrarily adjusted. As a result, the silicon wafer with the oxide film having the desired edge relief width can be accurately formed.

Further, it is preferable to set surface roughness Ra of a contact part of the mounting stage 13 with respect to the oxide film to 0.5 µm or below. As a result, an effect with respect to the mounting stage surface can be obtained. When the surface roughness Ra is set to 0.5 µm or below, the adhesion of the mounting stage surface and the oxide film formed on the wafer lower surface can be improved. As a result, it is possible to reduce a smudge region which is generated when an etching gas enters a gap between the mounting stage surface and the oxide film formed on the wafer lower surface. When the surface roughness Ra exceeds 0.5 µm, the etching gas enters the gap between the mounting stage surface and the oxide film formed on the wafer lower surface during the vapor-phase etching, and a smudge region width may be increased, which is not preferable. Among others, the surface roughness Ra of 0.4 µm or below is particularly preferable. It is to be noted that the surface roughness Ra represents center line average roughness (an Ra value) defined by JIS B 0601 (2011) in this specification. It is to be noted that the mounting stage 13 is not restricted to a configuration that its entire surface is flatly formed and brought into contact with the entire oxide film formed on the wafer lower surface, and it may be configured in such a manner that a concave portion is provided at a central part of the surface of the mounting stage 13, a ring-like portion is brought into contact with the periphery of the wafer lower surface, and the wafer is supported on this contact portion. As a result, the adhesion of the mounting stage surface and the oxide film formed on the wafer lower surface can be improved, and the smudge region can be reduced. In this case, it is further desirable to form the mounting stage 13 in such a manner that the surface of a portion other than the concave portion that is in contact with the oxide film can have the desired surface roughness.

Furthermore, it is also preferable for at least the surface of the portion of the mounting stage 13 that is brought into contact with the oxide film formed on the wafer lower surface to be made of at least one selected from polyvinyl chloride, polyvinylidene chloride, polyethylene, polypropylene, and polytetrafluoroethylene. When the mounting stage is made of such a material, it is possible to obtain effects that, e.g., acid resisting properties are excellent or scratches are hardly made at a time of disposing the wafer as compared with a mounting stage made of any other material.

As a method for setting the surface of the mounting stage 13 to the desired roughness, there is a method for forming the mounting stage itself using the polyvinyl chloride or the like and polishing the surface or a method for spraying a material, e.g., the polyvinyl chloride to the portion on the mounting stage surface that is made of a different material and brought into contact with the oxide film and then performing polishing so as to obtain the desired surface roughness.

Figure 3:
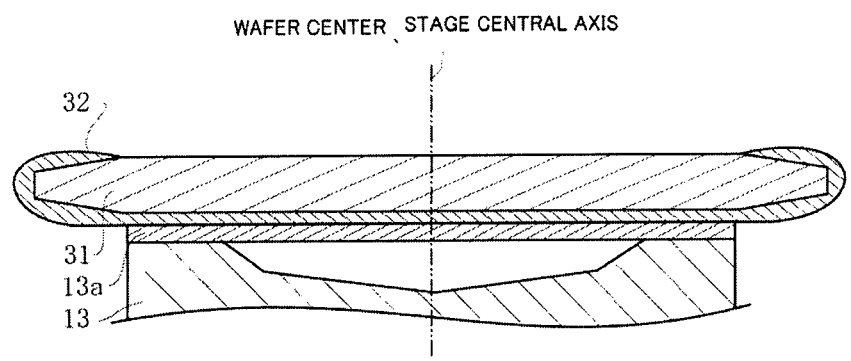
FIG. 3 is an enlarged cross-sectional view of a primary part showing a state that a silicon wafer before the vapor-phase etching treatment is mounted on the mounting stage having a resin film adhering to a surface thereof according to the embodiment of the present invention.

Furthermore, as shown in FIG. 3, when the surface of the mounting stage 13 is covered with a resin film 13a having the surface roughness Ra of 0.5 µm or below or more preferably 0.4 µm or below, the desired surface roughness can be obtained. It is preferable to use the resin film made of one selected from polyvinyl chloride, polyvinylidene chloride, polyethylene, polypropylene, and polytetrafluoroethylene for the above-described reason. According to this method, the apparatus does not have to be greatly improved, and the stage surface can be readily adjusted to the desired surface roughness in the existing apparatus.

Moreover, when the number of times of the vapor-phase etching treatment increases, the surface roughness of the stage surface gradually deviates from a set value due to time degradation of the apparatus. Therefore, a regenerative treatment, e.g., polishing the stage surface is required, but the method for attaching the detachable resin film having the desired surface roughness enables recovering the stage surface to the desired surface roughness by using an easy method, namely, replacing with a new resin film.

Figure 4:
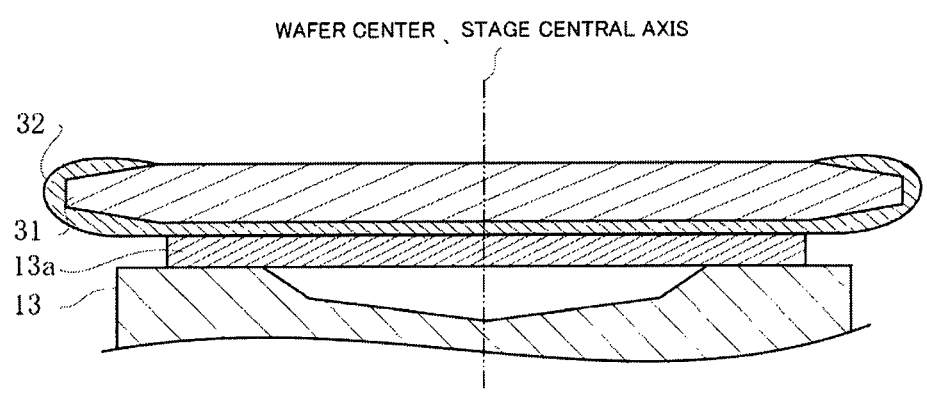
FIG. 4 is an enlarged cross-sectional view of a primary part showing an example of the mounting stage having the resin film adhering to the surface thereof different from the example depicted in FIG. 3.

Additionally, according to the method for attaching the resin film, as shown in FIG. 4, even if the mounting stage having a relatively large diameter is adopted, the present invention can be easily carried out without changing the diameter of the mounting stage 13 itself. That is, this is a method for setting a diameter of the resin film to a diameter smaller than that of the mounting stage so that the target desired interval a can be obtained and attaching this film to the surface of the mounting stage set in the existing apparatus. It is to be noted that, in this case, if a thickness of the resin film is too small, the interval between the oxide film and the stage surface becomes narrow, the effect of the present invention as described above is hardly obtained, and hence the resin film must be set to a relatively large thickness. In case of the method shown in FIG. 4, it is preferable to set the thickness of the resin film to fall within the range of 5 to 100 µm.

Then, the silicon wafer 31 having the oxide film 32 formed thereon is carried into the reaction container 11 of the vapor-phase etching apparatus 10. The silicon wafer 31 carried into the reaction container 11 is mounted on the mounting stage 13 in such a manner that the wafer lower surface having the oxide film 32 formed thereon faces the upper surface of the mounting stage 13 and a wafer center coincides with a central axis of the mounting stage 13 as shown in FIG. 2(a) or FIG. 4. The reaction container 11 into which the silicon wafer 31 has been carried is sealed with an upper lid 12, whereby the reaction container 11 is hermetically closed.

Further, a gas supply source provided outside the reaction container 11 shown in FIG. 1 is used to generate a hydrogen fluoride gas as the etching gas 14. This hydrogen fluoride gas can be generated by storing the aqueous solution 18, e.g., a hydrofluoric acid aqueous solution in the container 19, blowing the carrier gas 20 such as $N_2$ into the aqueous solution 18 in the container 19, and sufficiently performing bubbling until a saturated state is obtained. The generated hydrogen fluoride gas passes through the gas supply tube 16 that enables the container to communicate with the reaction container 11 as the etching gas 14, and it is circulated into the reaction container 11 from the gas supply opening 16a.

Furthermore, the hydrogen fluoride gas circulated into the reaction container 11 comes into contact with the excess oxide film formed on the wafer outer peripheral portion that is not in contact with the mounting stage, and the oxide film is thereby removed by etching. It is to be noted that the mounting stage may be rotated during the vapor-phase etching, but performing the etching without rotating the mounting stage is desirable in order to avoid occurrence of unevenness of etching caused due to an air current.

EXAMPLE

Next, examples according to the present invention are explained together with comparative examples in detail.

Example 1

A boron-doped p-type silicon wafer having a diameter of 200 mm, a chamfered width of 0.3 mm, and a resistivity of 0.01 μ·cm was first prepared, and an oxide film having a film thickness of 5000 angstroms was formed on a lower surface of this silicon wafer by the CVD method. At this moment, the oxide film is unavoidably formed on a chamfered surface and an end surface besides the wafer lower surface.

Then, a mounting stage 13 which has the surface roughness Ra of 0.5 μm at a contact portion with the oxide film and a concave portion shown in FIG. 2(a) formed at the center thereof and is made of polyvinyl chloride was installed in a reaction container 11 of a vapor-phase etching apparatus 10 shown in FIG. 1.

Subsequently, as shown in FIG. 1, the silicon wafer 31 having the oxide film formed thereon was carried into the reaction container 11 of the vapor-phase etching apparatus 10. Furthermore, as shown in FIG. 2(a), the carried silicon wafer 31 was mounted on the mounting stage 13 in such a manner that the wafer lower surface faces the upper surface of the mounting stage 13 and a wafer center coincides with a central axis of the mounting stage 13.

Then, as shown in FIG. 1, the reaction container 11 is hermetically sealed with an upper lid 12, $N_2$ was blown as a carrier gas into a container 19 in which a hydrofluoric acid aqueous solution is stored, the hydrofluoric acid aqueous solution was subjected to bubbling, and a hydrogen fluoride gas was generated. This hydrogen fluoride gas was circulated into the reaction container 11 from the gas supply opening 16a of the gas supply tube 16 as the etching gas 14. Moreover, when the oxide film 32 is brought into contact with the hydrogen fluoride gas, as shown in FIG. 2(b), the excess oxide film 32 formed on the wafer outer peripheral portion was removed by the vapor-phase etching.

Figure 5:
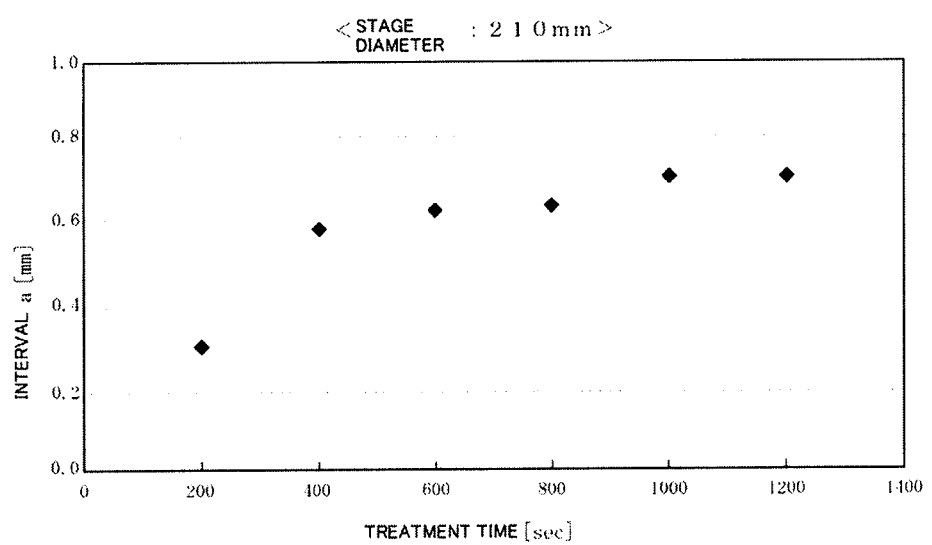
FIG. 5 is a graph showing a relationship between a treatment time and an interval a when the vapor-phase etching treatment is carried out using the mounting stage having a stage diameter of 210 mmφ in Example 1.
Figure 6:
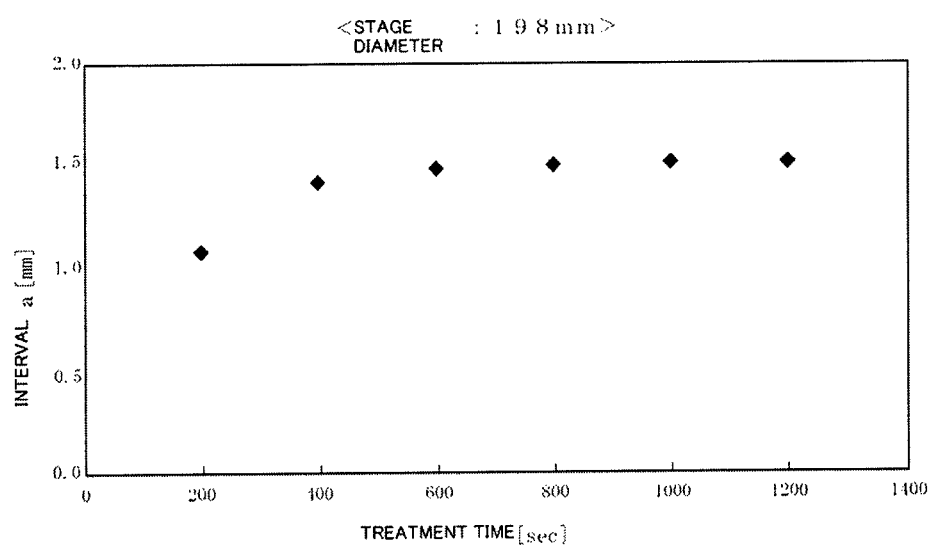
FIG. 6 is a graph showing a relationship between a treatment time and an interval a when the vapor-phase etching treatment is carried out using the mounting stage having a stage diameter of 198 mmφ in Example 1.
Figure 7:
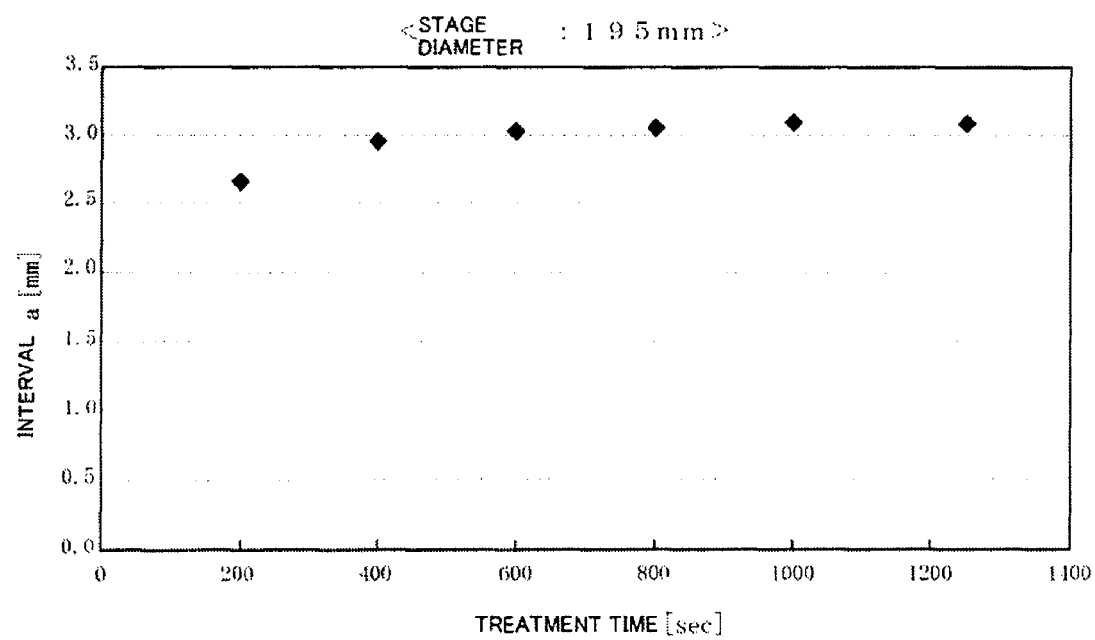
FIG. 7 is a graph showing a relationship between a treatment time and an interval a when the vapor-phase etching treatment is carried out using the mounting stage having a stage diameter of 195 mmφ in Example 1.

In this example, a stage diameter of the mounting stage 13 installed in the reaction container 11 was set to each of three standards, i.e., 210 mmφ, 198 mmφ, and 195 mmφ, and a removal width (an interval a) of an oxide film outer peripheral edge on the wafer lower surface when an etching treatment time was changed was measured. FIG. 5 to FIG. 7 show results thereof. It is to be noted that a value of the interval a in each of FIG. 5 to FIG. 7 is a value obtained by subtracting a value of the chamfered width from a length measured from the wafer end surface to the oxide film on the wafer lower surface.

As obvious from FIG. 5 to FIG. 7, when the mounting stage having the stage diameter of 210 mmφ was used and the etching was performed, the interval a was controlled to 0.70 mm even though an etching treatment time was prolonged to 1200 seconds. On the other hand, the interval a was 1.50 mm when the mounting stage having the stage diameter of 198 mmφ was used, the interval a was 3.10 mm when the mounting stage having the stage diameter of 195 mmφ was used, and it can be understood that a width of the interval a can be increased as the stage diameter is reduced. Therefore, it was confirmed that the diameter of the mounting stage to be used and the width of the interval a have a correlation, and it can be understood that the interval a can be controlled to a desired width by adjusting the stage diameter.

Example 2

The surface roughness of the mounting stage 13 was changed like the following Test Examples 1 to 5, and a relationship between the surface roughness of the stage surface and a width of a smudge produced region was examined.

Test Example 1

A mounting stage 13 having a stage diameter of 198 mmφ and the surface roughness Ra of 0.5 μm was used, an etching treatment time was set to 600 seconds, and an excess oxide film 32 formed on a wafer outer peripheral portion was removed by the vapor-phase etching like Example 1.

Test Example 2

An excess oxide film 32 formed on a wafer outer peripheral portion was removed by the vapor-phase etching like Test Example 1 except that a mounting stage 13 having the surface roughness Ra of 0.4 μm was used.

Test Example 3

An excess oxide film 32 formed on a wafer outer peripheral portion was removed by the vapor-phase etching like Test Example 1 except that a mounting stage 13 having the surface roughness Ra of 0.3 μm was used.

Test Example 4

An excess oxide film 32 formed on a wafer outer peripheral portion was removed by the vapor-phase etching like Test Example 1 except that a mounting stage 13 having the surface roughness Ra of 6.5 μm was used and a resin film made of polyvinylidene chloride having the surface roughness Ra of 0.05 μm was attached to the mounting stage 13.

Test Example 5

An excess oxide film 32 formed on a wafer outer peripheral portion was removed by the vapor-phase etching like Test Example 1 except that a mounting stage 13 having the surface roughness Ra of 6.5 μm was used.

Figure 8:
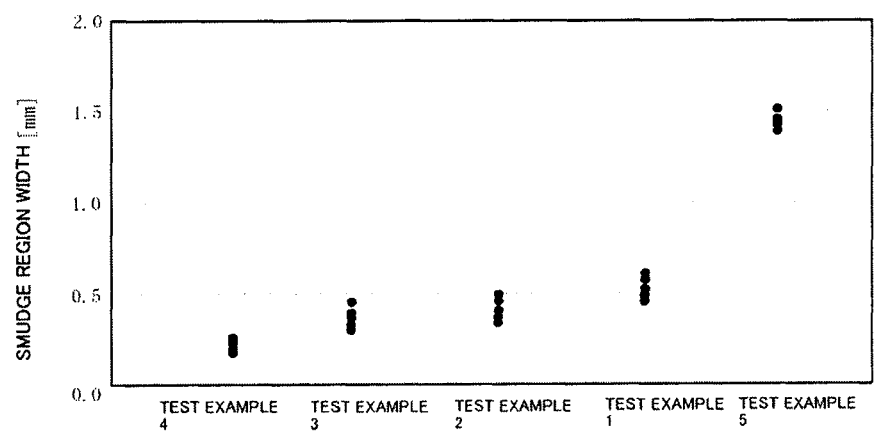
FIG. 8 is a view showing a measurement result of a smudge region width in Example 2.
Figure 9:
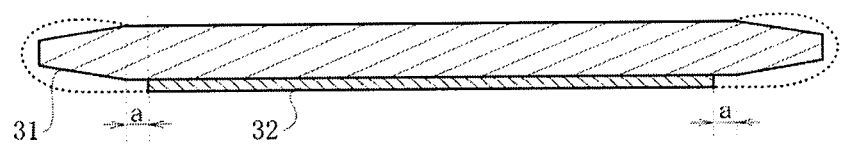
FIG. 9 is a cross-sectional view of a general silicon wafer having a predetermined edge relief width formed thereto.
Figure 10:
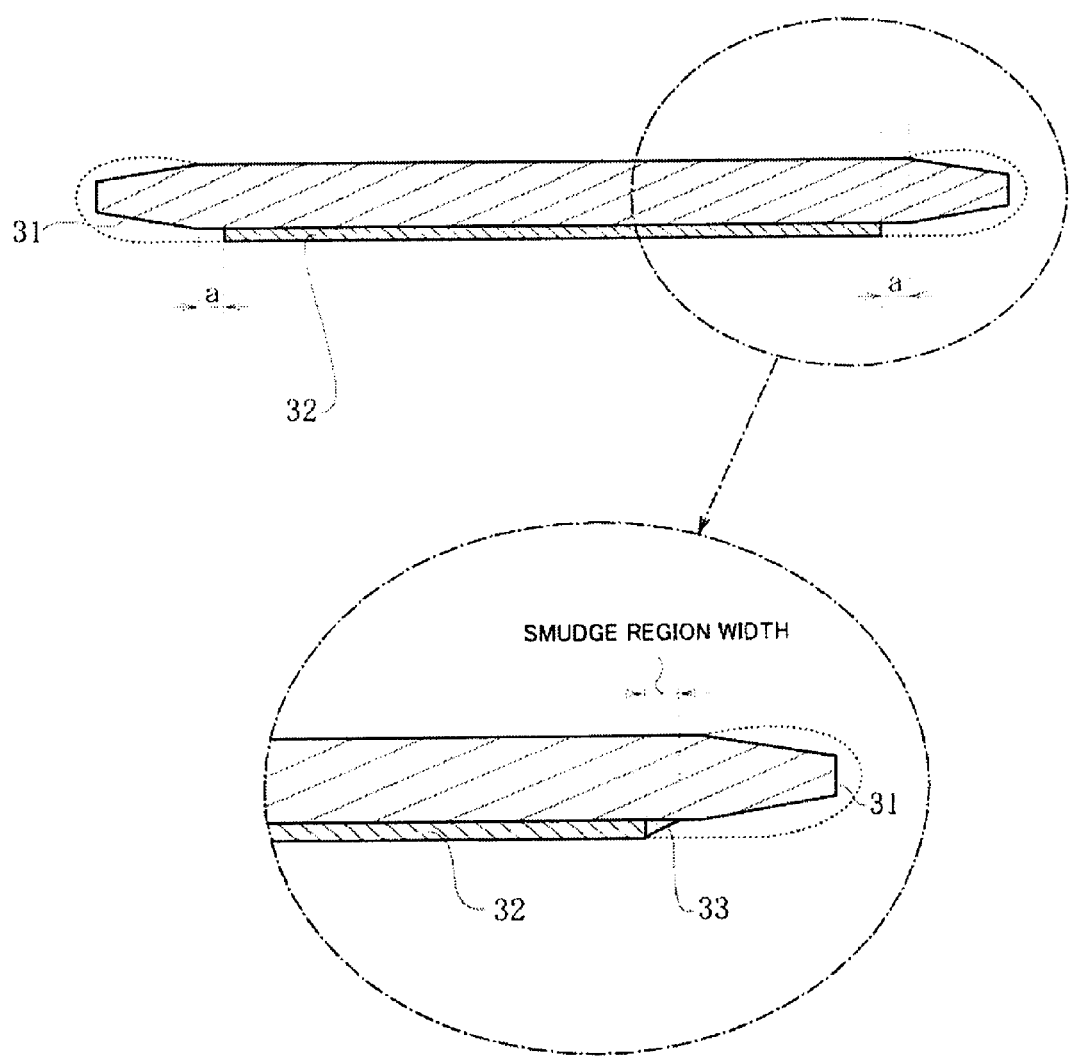
FIG. 10 is an enlarged cross-sectional view of a primary part showing a state of a silicon wafer having a smudge region generated thereon.

<Comparison Test and Evaluation 1> In each of Test Examples 1 to 5, the vapor-phase etching was carried out under the same conditions for a total of five times, and a smudge region width was measured. Each smudge region width was measured using an optical microscope. FIG. 8 shows results of the measurement.

As obvious from FIG. 8, it can be understood that the smudge region width is very small in each of Test Examples 1 to 4. In Test Examples 2 to 4 in particular, it can be understood that the smudge region width is as very small as 0.5 mm or below in each of all results.

Example 3

5 silicon wafers subjected to the vapor-phase etching in each of Test Examples 1 to 5 in Example 2 were sampled in accordance with each test example. In regard to each wafer, an epitaxial film was formed on a surface of a wafer upper surface side having no oxide film formed thereon, and whether nodules were produced in a smudge region on a wafer lower surface was confirmed by visual examination.

The epitaxial film was formed using a single-wafer processing epitaxial apparatus, a trichlorosilane gas as a raw material source gas and a diborane gas as a dopant gas were supplied, and a p-type silicon epitaxial film having a thickness of 2 μm was formed on the silicon wafer surface at a temperature of 1150° C.

As a result, generation of a certain number of nodules was confirmed in a smudge region of one of silicon wafers, each of which has the epitaxial film formed thereon, obtained in Test Example 5. On the other hand, generation of nodules was not confirmed in the smudge region of silicon wafers, each of which has the epitaxial film formed thereon, obtained in Test Examples 1 to 4.

What is claimed is:

1. A method for removing an oxide film formed on a surface of a silicon wafer, comprising:
   preparing a silicon wafer which has an upper surface, a lower surface, a chamfered surface, and an end surface and has an oxide film formed on at least the entire lower surface of the silicon wafer;
   arranging one or more discoid wafer mounting stages, each of which has at least a contact portion with the oxide film being formed of an acid-resistant resin layer, in a reaction container of a vapor-phase etching apparatus;
   mounting the silicon wafer on the mounting stage in such a manner that the lower surface of the silicon wafer faces an upper face of the mounting stage and a wafer center coincides with a central axis of the mounting stage;
   circulating a hydrogen fluoride containing gas into the reaction container and removing the oxide film from an interface between the chamfered surface and the wafer lower surface toward the inner side of the wafer until a desired interval a is obtained; and
   adjusting the desired interval a by changing a stage diameter of the mounting stage.

2. A method according to claim 1, wherein surface roughness Ra of the mounting stage at the contact portion with the oxide film is 0.5 μm or below.

3. A method according to claim 2, wherein the surface roughness Ra of the mounting stage at the contact portion with the oxide film is 0.4 μm or below.

4. A method according to claim 1, wherein the acid-resistant resin layer is made of any one selected from polyvinyl chloride, polyvinylidene chloride, polyethylene, polypropylene, and polytetrafluoroethylene.

5. A method according to claim 1, wherein the acid-resistant resin layer comprises a detachable resin film having the surface roughness Ra of 0.5 μm or below.

6. A method according to claim 5, wherein the surface roughness Ra of the resin film is 0.4 μm or below.

7. A method according to claim 5, wherein the resin film is made of any one selected from polyvinyl chloride, polyvinylidene chloride, polyethylene, polypropylene, and polytetrafluoroethylene.

8. A method according to claim 1, wherein a stage having a concave portion formed at a central part of a mounting surface is used as the mounting stage.

9. A method according to claim 1, wherein the adjusting the desired interval a is performed in accordance with a resistivity of the silicon wafer.

10. A method according to claim 1, wherein the desired interval a is defined as a removal width of the oxide film at an outer peripheral edge on the wafer lower surface.

* * * * *